United States Patent [19]

Myer

[11] 4,064,496
[45] Dec. 20, 1977

[54] WAVERING CONDUCTOR LOOPS FOR MAGNETIC DOMAIN MEMORIES

[75] Inventor: Jon H. Myer, Woodland Hills, Calif.

[73] Assignee: Hughes Aircraft Company, Culver City, Calif.

[21] Appl. No.: 701,829

[22] Filed: July 1, 1976

[51] Int. Cl.² .............................................. G11C 19/08
[52] U.S. Cl. .......................................... 365/19; 365/8; 365/17; 365/40; 365/35
[58] Field of Search .................................. 340/174 TF

[56] References Cited

PUBLICATIONS

IBM Technical Disclosure Bulletin - vol. 14, No. 7, Dec. 1971, pp. 2144-2145.

*Primary Examiner*—James W. Moffitt
*Attorney, Agent, or Firm*—Gregory B. Wood; W. H. MacAllister

[57] ABSTRACT

Disclosed are magnetic domain (bubble) memory arrays and correlator type memory arrays in uniaxially anisotropic crystals which utilize wavering loop conductor patterns at each bit location defining three contiguous magnetic domain retaining regions. On current reversal a bubble in the center loop of a wavering loop pattern will be equally attracted to either of the outside loops. Decision control is provided by a second array of two conductor lines interposed between the respective domain retaining regions. These control conductors establish an aiding or inhibiting magnetic field when current flows through them. In an alternate design a correlator function is obtained by using bubbles retained in previously disclosed bistable loops as memory elements and interrogating them by means of auxiliary bubbles driven by adjacent wavering loops. In operation, the bistable conductor loops defining the two memory states are placed on either side of a crystalline platelet to jointly define two domain retaining memory regions. The presence of a bubble at either memory site is sensed by its repulsion of an adjacent interrogating bubble controlled by a wavering loop pattern. Magnetoresistive sensors are placed in sensing relationship to one of the three regions defined by the wavering loop conductor pattern.

13 Claims, 12 Drawing Figures

WAVERING CONDUCTOR LOOPS FOR MAGNETIC DOMAIN MEMORIES

BACKGROUND OF THE INVENTION

1. Field of the Invention

This invention relates to digital data processing, storing and signal translating devices utilizing cylindrical magnetic domains (commonly called magnetic bubbles) in a uniaxially anisotropic magnetic medium such as a single orthoferrite crystal platelet. The present invention relates particularly to novel conductor patterns whereby the number of terminals and address planes required in prior bubble memories may be reduced. Additionally, this conductor pattern is utilized in a novel integrated correlator-memory to perform digital logic functions as well as nonvolatile bit storage with nondestructive readout on a single crystalline platelet using only two planar conductor arrays without crossovers.

2. Prior Art

Digital processing, storing and translating devices comprised of conductor arrays in magnetic coacting relationship with a uniaxial anisotropic crystalline platelet are well known. For example, several different serial shift register devices are described in the June 1971 issue of the magazine *Scientific American* in an article entitled "Magnetic Bubbles" written by A. H. Brobeck and H. E. D. Scovil. A rudimentary orthogonal array is described in U.S. Pat. No. 3,513,452, issued to Brobeck et. al, on May 19, 1970.

Improvements in the art of digital memories using magnetic bubbles were disclosed in my U.S. Pat. No. 3,806,899 entitled "Magneto Resistive Read-Out for Domain Addressing Interrogator," wherein conductor arrays defined two continuous domain retaining regions at each bit. In that patent, only one crystalline platelet was necessary when an optical readout means was employed. However, when magnetoresistive or other interrogation means were employed, independent control of magnetic bias on two platelets in close proximity as well as exact superposition and optical registration of the two platelets was required. Furthermore, light passing through the required two platelets in series caused twice the attenuation, thereby reducing the signal-to-noise ratio by one-half.

In my U.S. Pat. No. 3,806,903 entitled "Magneto-Optical Devices," there is disclosed a conductor array for a bubble device utilizable as a subtractive comparator or a random access memory. This device also had dual domain retaining regions at each bit location. However, the comparator function and the memory function could not be done simultaneously on a single platelet. Thus, if both functions were desired, two crystalline platelets were required with the disadvantages previously mentioned.

The devices disclosed in these two prior patents provided for various means of sensing the location of a bubble at one of two possible positions at each bit location in a single crystal platelet and disclosed a particular drive conductor configuration uniquely suited for this purpose. These devices contemplated use of separate interrogating or readout means such as a second crystal platelet positioned adjacent to the first. In my U.S. Pat. No. 3,878,542 entitled "Movable Magnetic Domain Random Access Three-Dimensional Memory Array," I disclosed an improved conductor array pattern which facilitated moving a single readout bubble between any one of three bit positions at a single bit location to permit both storage and readout functions from a single platelet. However, that device when utilizing a single platelet related only to memory storage and interrogation functions. No parallel correlation processing was possible as in the correlator-type array disclosed herein. If a correlation processing function was desired, two crystalline platelets were still required. Even in a pure storage and interrogation embodiment, each address coordinate required at least two conductors, one defining two contiguous domain retaining regions and the other defining a third contiguous domain retaining region.

Finally, some of the prior art conductor patterns have had sharp corners which formed spurious domain retaining regions thereby allowing bubbles to occasionally be captured at these sites in an uncontrolled manner. This limited the bit size of such memories.

Consequently, it is the general object of the present invention to provide an improved conductor array pattern for magnetic bubble devices. More specifically, it is an object of the present invention to provide a conductor array for bubble memories which decreases the number of terminals required per bit column and row. Another object of the present invention is to provide a bubble correlator-memory within the memory and correlator functions are integrated on a single crystalline platelet. Still another object of the present invention is to provide a correlator-memory which can stimultaneously store data in an updatable nonvolatile random access memory with non-destructive readout; provide sequential or parallel interrogation; and perform an "exclusive nor" logic function by mutual repulsion of juxtaposed wavering bubble domains in interrogation lines. Yet another object of the present invention is to provide a multiple bit conductor array pattern for bubble memories which eliminates the capture of bubbles at spurious locations. Still another object of the present invention is to provide a means of performing bit-addressable bipolar correlation of digital information at high speed with low power consumption.

SUMMARY OF THE INVENTION

The invention disclosed herein uses orthoferrite crystals to achieve bubble devices such as a random access memory and a comparator-type memory which afford non-destructive readout and fast operation in either a serial or parallel processing mode. In both devices, bubble domain locations are defined by novel meandering conductor patterns deposited directly on the crystal or on juxtaposed insulating plates which are positioned adjacent to an associated crystal in which bubble domains are established and sustained by magnetic fields generated by permanent magnets. Just as in all my previously disclosed bubble memory logic inventions the bubbles are permanently installed in the crystal platelet during manufacture.

In the random access memory, a meandering wavering loop pattern conductor array defines three contiguous domain retaining regions in a crystal platelet where, for example, the left outside loop defines a "store zero" region, the center loop defines an "idle or readout" region, and the right outside loop defines a "store one" region.

Since a bubble in the center "idle" region will be equally attracted to either of the outside regions when a position transferring current flows, and will therefore "waver" instead of moving, a first aiding conductor is aligned between the "idle" and "store one" regions and a second aiding conductor is aligned between the "idle" and the "store zero" region. Decision control to eliminate the above-mentioned wavering instability and define two stable modes occurs when coincident half currents flow through one of the aiding conductors and the corresponding wavering loop, facilitating the transfer of a bubble between the adjoining regions of the addressed wavering loop.

In the correlator-memory embodiment, the memory function is provided by two conductors orthogonally positioned so that at each bit location the conductor patterns cooperate to define two contiguous memory regions representing a "store one" and "store zero" in the crystal platelet, in one of which regions resides a captured bubble as described in my U.S. Pat. No. 3,806,903. Adjacent to and on either side of the memory conductor and in the same plane are two interrogation conductors having a series of wavering loop patterns, each defining three contiguous bubble retaining regions so that at each bit location there is a wavering loop pattern on either side of the memory pattern. Decision control to prevent wavering instability in the resident interrogating bubble when it is positioned in the center loop is provided by high permeability bars that provide magnetic coupling between one memory region and one of the interrogating wavering loop patterns and the other memory region and the the other interrogating wavering loop pattern.

Correlation between bubbles in the interrogator arrays and the memory array at each bit occurs when current of appropriate polarity flows through the interrogator lines to cause position control over the resident bubble in each wavering loop pattern. Detection of correlation occurs by simultaneously or sequentially observing one site in the wavering loop pattern on either side of the memory pattern at each bit location. Such observation may be optical, magnetoresistive, inductive, by using Barkhausen sensors or by any other suitable means.

BRIEF DESCRIPTION OF THE DRAWINGS

The invention will be better understood from the detailed description below taken in conjunction with the drawing wherein like reference characters refer to like parts throughout and in which.

DETAILED DESCRIPTION OF PREFERRED EMBODIMENTS

Figure 3A:
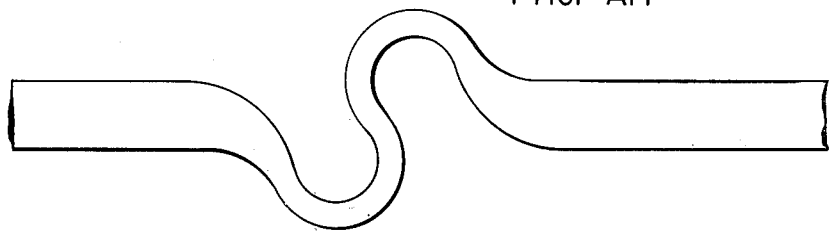
FIGS. 3a, and 3b show the meandering bistable and wavering loop patterns respectively.
Figure 3B:
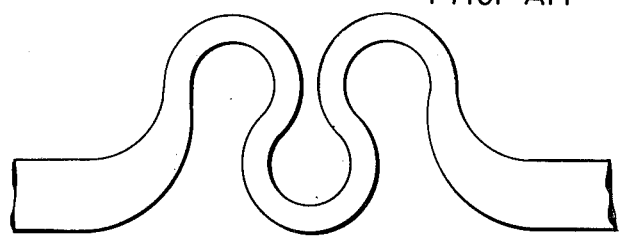

Referring first to FIGS. 3a and 3b, there is respectively shown a representation of the prior art's bistable loop pattern and the novel wavering loop patterns employed in the embodiments of the present invention. Thus, in addition to the "store one" and "store zero" regions of the bistable pattern, the pattern in accordance with the invention has an additional region defined by a third loop which represents an "idle-reset" state when a bubble resides in that region.

Figure 1:
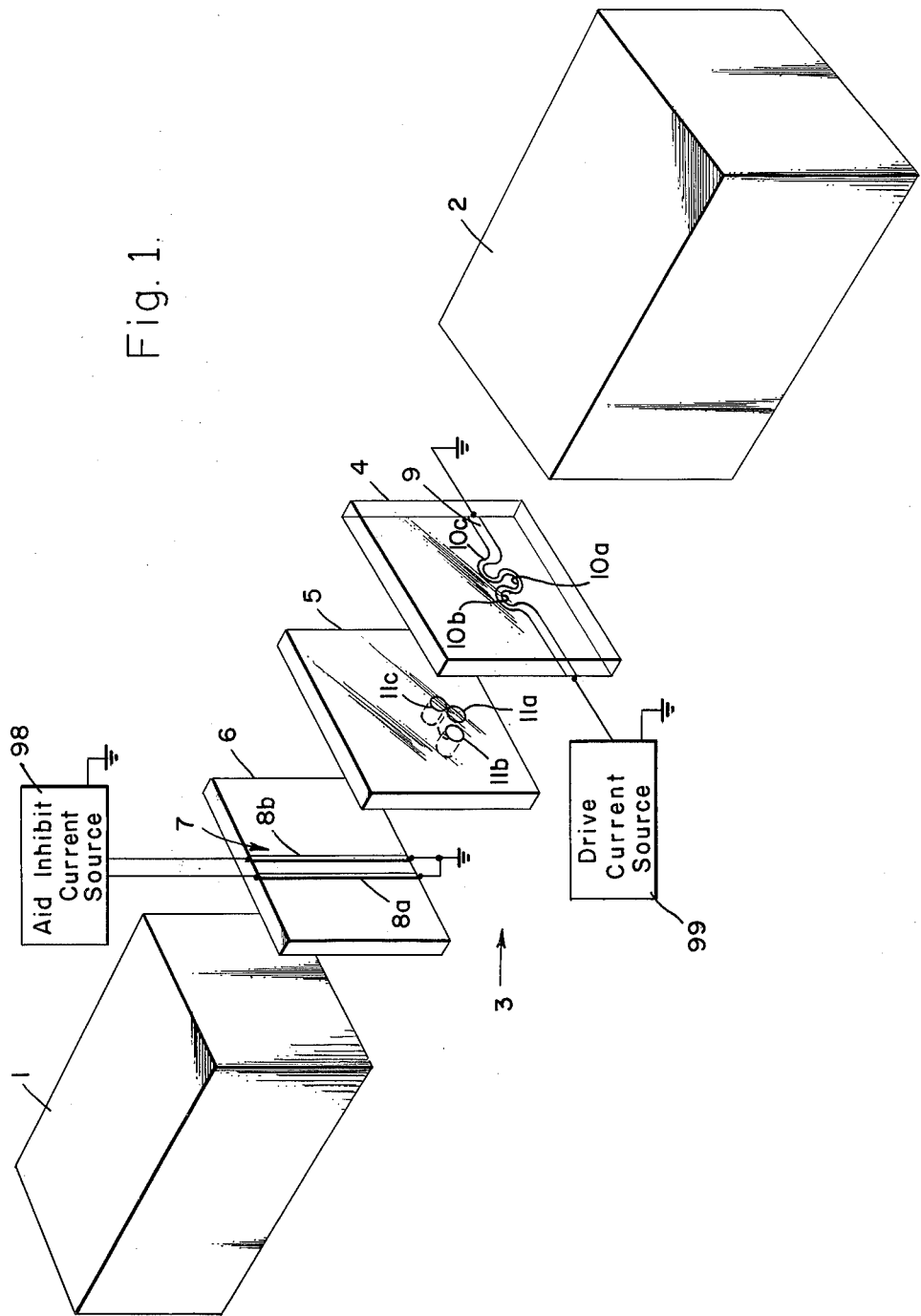
FIG. 1 is an exploded partial schematic perspective view including representative elements of a bubble random access memory embodiment using the conductor patterns disclosed.

Referring now to FIG. 1, there is shown one possible configuration of a nonvolatile, nondestructive readout memory with random access embodying the wavering loop conductor array sandwich 3 in accordance with the present invention. Also shown is an optical readout means (not the subject of the present invention) which includes illumination means 1 and detection means 2. The required magnetic biasing means is not shown in this illustration. Also shown is drive current source 99 coupled schematically to conductor pattern 9 and aid-inhibit current source 98 for supplying current to at least one of the conductors 8a and 8b so as to provide an addressable binary memory. Extensions of the memory to multiple bits will be obvious to those skilled in the art. One possible specific embodiment of an optical readout means is disclosed at pages 6 and 7 in my related U.S. Pat. No. 3,806,903 entitled "Magneto-Optical Cylindrical Magnetic Domain Memory," issued Apr. 23, 1974.

The bistable conductor array sandwich 3 shown comprises a magnetocrystalline platelet 5, interposed between a first substantially transparent insulating plate 4 and second substantially transparent insulating plate 6. Plates 4 and 6 may be made out of glass and platelet 5 may be of a magnetocrystalline material such as rare earth orthoferrite wherein cylindrical magnetic domains or bubbles are created when the platelet is immersed in a magnetic bias field. A typical process of creating and maintaining such "bubbles" is disclosed in columns 3 through 5 in the aforementioned U.S. Pat. No. 3,806,903. The first insulating plate 4 has a wavering loop conductor array pattern 9 (in the X address direction, for example) on one surface parallel to the surface of platelet 5 and oriented to be in magnetic coacting relationship therewith. The second insulating plate 6 has a second electrical conductor pattern 7 (in the Y address direction, for example) in the form of two straight aid-inhibit control lines 8a and 8b on one of its surfaces parallel to the major plane of the platelet and oriented to be in magnetic coacting relationship therewith.

It will be appreciated that the various conducting patterns may be placed directly on the crystalline platelet so long as they are electrically insulated from each other. As illustrated in FIG. 1, the X array, comprising the first half of the addressing scheme, is formed on the insulating platelet 4 and faces the adjoining crystal platelet 5. This array consists of wavering loops 10a, 10b and 10c. The Y array, comprising the second half of the addressing scheme, is formed on insulating platelet 6 and consists of two straight aid-inhibit control conductors 8a and 8b also facing the adjoining crystal platelet 5.

To establish the idle-reset state, current of an appropriate polarity flowing in the wavering loop pattern attracts the bubble in the crytal platelet 5 and positions it in the central position 11a.

To store a "one" the current polarity in the wavering loop pattern is reversed establishing an unstable condition for the bubble since it is now attracted with equal force to the left ("zero") and right ("one") loops 11b and 11c of the wavering loop pattern. Selection of the desired bit is performed by energizing the conductors in the Y array with currents of suitable polarity to facilitate transfer to the right ("one") position and inhibit transfer to the left ("zero") position.

Figure 2:
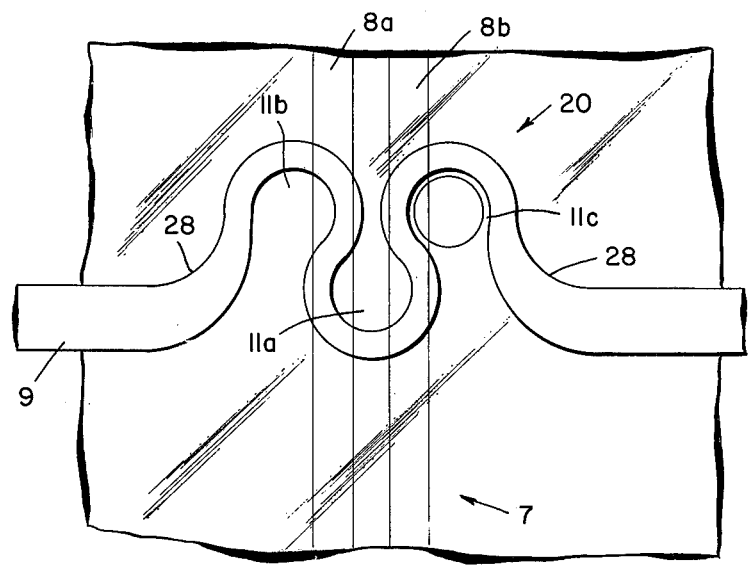
FIG. 2 shows the X and Y conductor patterns of simple bubble memory employing the wavering loop with the orientation of the read and write control conductors superimposed.

Referring now to FIG. 2, the first (X) and second (Y) conductor arrays for one binary memory bit are shown superimposed in the preferred orientation parallel to the major plane of the crystalline platelet. The wavering loop pattern 20 defines three distinct magnetic domain or bubble retaining regions 11a, 11b and 11c when X and Y conductor patterns are aligned with each other in magnetic relationship with the crystal platelet, while the straight "Y" array 7 provides the necessary aid-inhibit, i.e. decision control.

Array 7 is comprised of "zero" aiding conductor 8a positioned in magnetic coacting relationship between regions 11b and 11a, and "one" aiding conductor 8b positioned in magnetic coacting relationship between regions 11c and 11a. Thus, when a current of suitable polarity flows through the "zero" aiding conductor 8a, a magnetic field is created which aids the transfer of the bubble into the left "zero" bubble retaining region 11b. Conversely, when current flows through the "one" aiding conductor 8b, the magnetic field created aids the transfer of the bubble into the right "one" bubble retaining region 11c.

Reversal of the current polarity in the "Y" array conductors 8a and 8b will inhibit the above transfers. It is thus possible to increase the reliability of a transfer to the "one" position by energizing the conductor 8b with an aiding polarity current while simultaneously energizing the conductor 8a with an inhibiting polarity current. It is also apparent that the aid-inhibit control lines do not have to be perfectly straight but can be made to conform to a meandering shallow S matching the wavering loop curvature at the interaction site.

As in my previous U.S. Pat. No. 3,878,542, additive half currents simultaneously flowing through the respective conductors must combine to induce a sufficient magnetic field to cause the bubble to move from the central idle-reset region to an adjacent storage retaining region.

Thus, simultaneous additive half currents flowing through the "one" aiding conductor 8b and the X axis conductor 9 cause the bubble to move to the stored "one" site 11c by causing an increase in the bias field in the center portion of the wavering loop and reducing the bias field in the adjacent "one" loop. Similarly, additive half currents flowing through the "zero" aiding conductor 8a and wavering loop pattern 9 cause the bubble to move to the store "zero" site 11b by causing an increase in the bias field in the center portion of the wavering loop and reducing the bias field in the adjacent "zero" loop. It will, of course, be understood that reference to "half currents" means any current which is insufficient alone to cause a bubble to change position but which is sufficient when combined with another "half current."

FIG. 2 it will be noted that the X axis conductor 9 is comprised of active curvature portions which define bubble retaining regions 11a, 11b and 11c and inactive curvature portions 28 which provide lead-in and lead-out loop-to-conductor transitions. Tests have revealed that some of the sharp turns in the inactive curvature portion of previous configurations create uncontrolled attraction for nearby bubbles causing them to occasionally be trapped in spurious locations. Consequently, it is preferable in the various embodiments of the present invention to make the radii of inactive curvatures approximately twice the radii of the active curvature portions. In one case, for example, the radii of the active curvature portions were chosen to be 55 micrometers while the radii of the inactive curvature portions had minimum radii of 100 micrometers. Such a radius relationship effectively prevented the attraction and trapping of bubbles in spurious locations.

It will be appreciated that all wavering loops in a column are controlled by a single pair of aid-inhibit control lines 7 so that at a specified time all bits of one column are simultaneously addressed by the aid-inhibit line half currents.

The need for the decision control means which in the present embodiment comprise control conductors 8a and 8b becomes apparent when the bubble is sought to be transferred from the middle position 11a. Without the magnetic field induced by current flowing through one of the control conductors 8a or 8b, an instability would arise since the bubble in region 11a would be equally attracted to both regions 11b and 11c. However, when current flows through one of the control conductors 8a or 8b in a direction which weakens the bias field in the target loop the bubble is effectively aided to move to the chosen adjoining region. The current in the control lines is kept low enough so that energizing only the "X" wavering loop lines or the "Y" control lines does not provide sufficient magnetomotive force to displace the bubbles. Thus, in order to store a bit at a particular array site it is necessary to energize the desired wavering loop X row and the desired ("one" or "zero") Y column with coincident aiding half current pulses.

The simplest readout method for this memory array consists of monitoring the areas of the two side loops of the wavering loop pattern by Faraday rotation detectors. In this manner all sites are monitored continuously and in parallel and readout is nondestructive. An alternate nondestructive readout method which does not require optical transparency of the platelets employs a magnetoresistive sensor at the "one" loop position of the wavering loop. Such a detector will signal the presence of a bubble at the "one" site.

Figure 6:
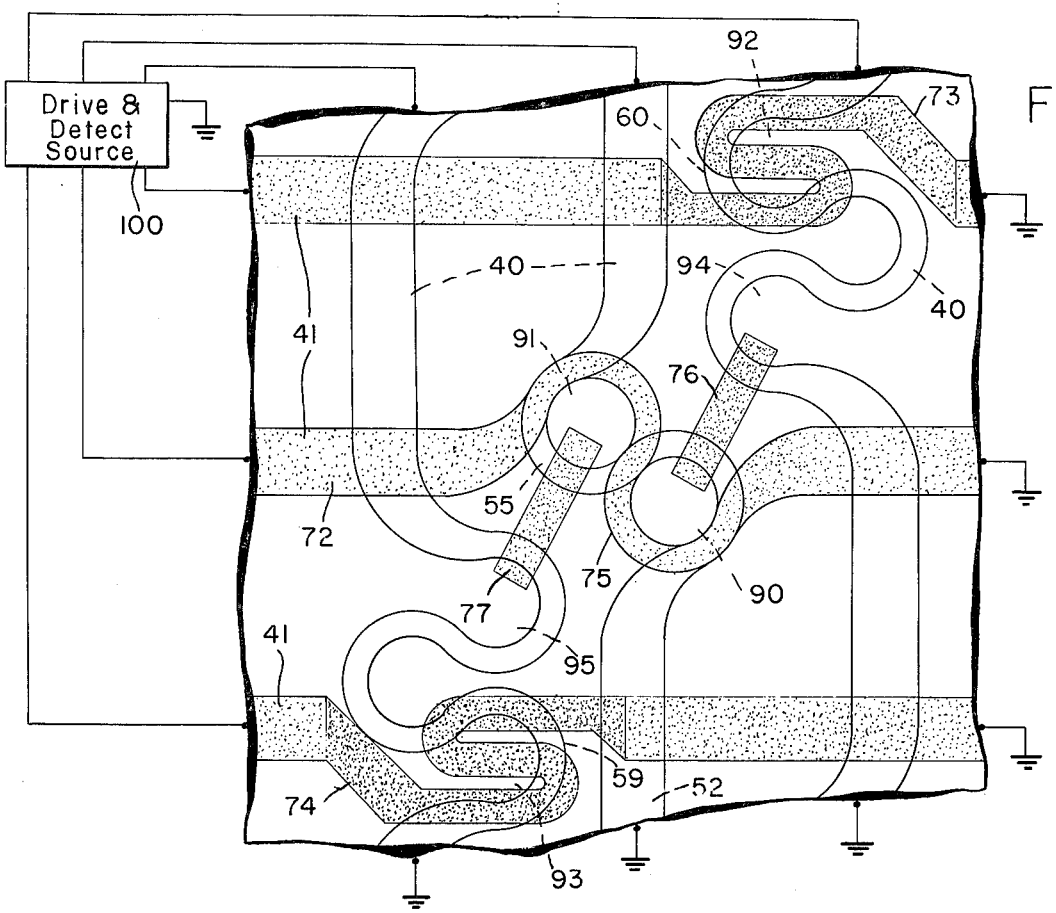
FIG. 6 is a partial schematic showing the superimposed orientation of the conductor patterns of FIGS. 4 and 5 aligned parallel to a major plane of the crystalline platelet.

Referring now to FIG. 6, there is shown a top view of a conductor configuration using wavering loop patterns to form one bit of a correlator-type memory on a single crystalline platelet. In FIG. 6, a magnetocrystalline platelet is sandwiched between first and second conductor triplets 40 and 41, which are electrically insulated from but in magnetic coacting relationship with one another. The magnetic crystalline platelet has bubbles formed and maintained such as by a suitable bias field. While the conductor triplets 40 and 41 may be placed directly on the two major surfaces of the crystalline platelet, it will be appreciated that they may be placed on separate adjacent insulating plates or any other convenient way to facilitate alignment and assure their magnetic control of the bubbles in the crystalline platelet. Also shown is drive current source 100 for selectively supplying drive current to the conductor sets 41 and 40.

Figure 4:
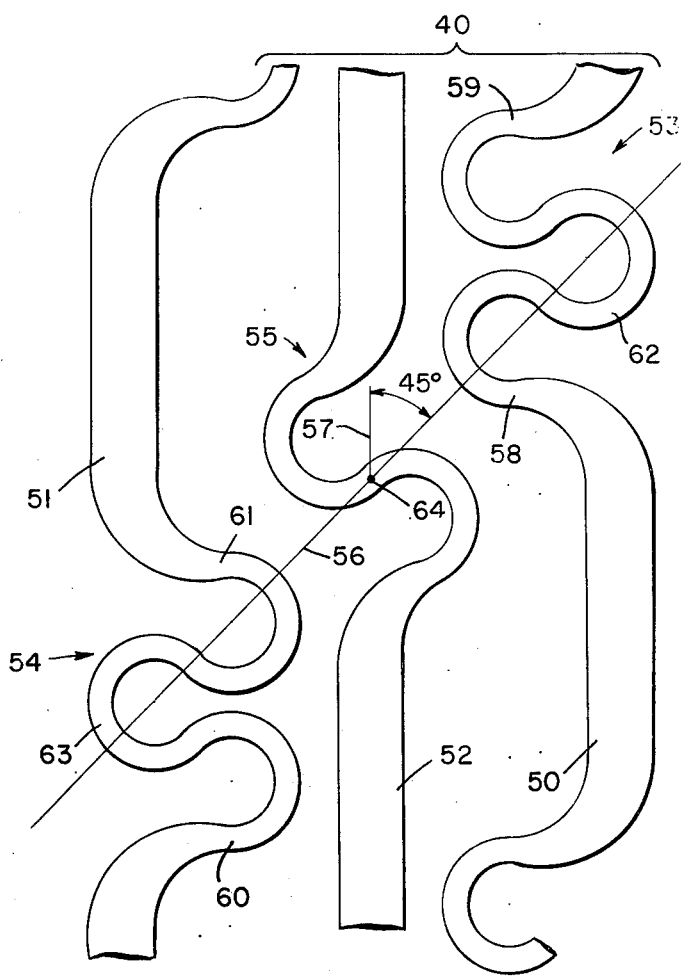
FIG. 4 is a detailed top view of a first conductor pattern for one bit of the correlator-type memory which includes a bistable loop memory region and two adjacent wavering loop interrogating patterns.

Referring now to FIG. 4, there is shown a top view of the first conductor triplet 40 of FIG. 6, which comprises a first interrogating line 50 having a first wavering loop pattern 53, a second interrogating line 51 having a second wavering loop pattern 54, and a first stored memory line 52 between the first and second interrogating lines having a first bistable loop region 55. In the preferred embodiment, the apertures of the outside loops 58 and 59 and 60 and 61 of the two wavering loop patterns 53 and 54 are positioned outward and away from the stored memory line 52. In this preferred orientation, the centers of the middle loops 62 and 63 are positioned on a straight line 56 which passes through the center 64 of the bistable loop region 55 to form an angle of approximately 45° with the vertical axis 57.

Figure 5:
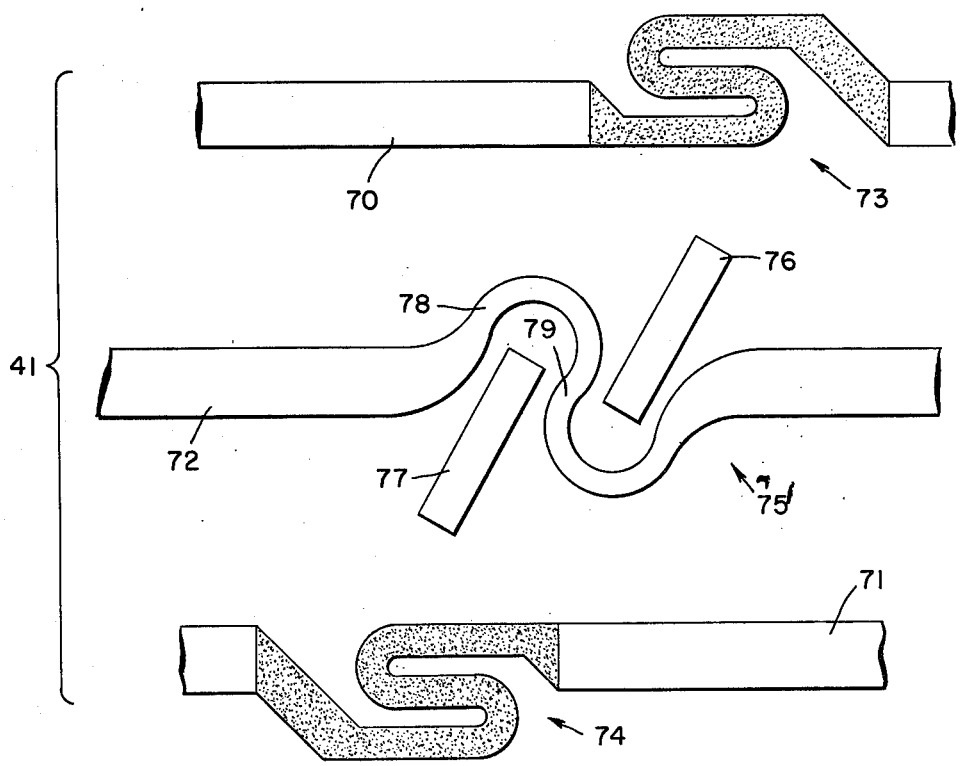
FIG. 5 is a detailed top view of a second conductor pattern for one bit of the correlator-type memory to be positioned in magnetic coacting relationship to the conductor pattern of FIG. 4 which includes an orthogonal bistable loop pattern, two adjacent bubble sensing magnetoresistors and two permalloy coupling bars.

FIG. 5 is a top view of the second conductor triplet 41 shown in FIG. 6 and comprises a first sensing line 70 having a first sensing region 73, a second sensing line 71 having a second sensing region 74, and a second stored memory line 72 positioned between the first and second sensing lines 70 and 71 and having a second bistable loop region 75.

A first magnetic coupling means 76 and a second magnetic coupling means 77 are also shown and provide magnetic coupling between the memory loop region 75 and the respective wavering loop patterns of the interrogating lines 50 and 51 shown in FIG. 4. In the preferred embodiment, the first and second coupling means are permalloy bars positioned in the two apertures of the bistable loop 78 and 79, and the respective sensing regions 73 and 74 are magnetoresistive elements such as those disclosed in U.S. Pat. No. 3,806,899, entitled "Magneto Resistive Read-Out for Domain Addressing Interrogator." While the use of sensing lines having integral magnetoresistive sensing portions therein is preferred, optical, inductive, Barkhausen, or any other sensing means may be utilized without departing from the spirit of the invention.

Referring again to FIG. 6, the two conductor triplets 40 and 41 are shown in their preferred superimposed alignment where the second conductor triplet 41 represents the X axis address and the first conductor triplet 40 represents the Y axis address. The first and second bistable loop regions 55 and 75 are superimposed to define two domain retaining regions 90 and 91 in one of which resides a captured permanently installed magnetic domain bubble (not shown). For example, the orientation may be defined so that a bubble residing in region 90 represents a stored "one" while a bubble residing in region 91 represents a stored "zero". The bubble may be moved from region 90 to 91 and vice versa by simply reversing the additive half currents in stored memory lines 52 and 72. As in the previous embodiment, additive half currents flowing through conductors 52 and 72 are utilized to induce a magnetic field of sufficient strength to cause the bubble to change positions. This effect is more fully explained at pages 3 and 4 in my U.S. Pat. No. 3,806,899, entitled "Magnetoresistive Readout for Domain Addressing Interrogator."

Also shown in FIG. 6 is the alignment of sensing portions 73 and 74 in magnetic sensing relationship with domain retaining regions 92 and 93, defined by readout loops 59 and 60 respectively. Th permalloy coupling bars 76 and 77 are shown in magnetic coupling relationship between region 90 and region 94 and region 91 and region 95 respectively.

Figure 7:
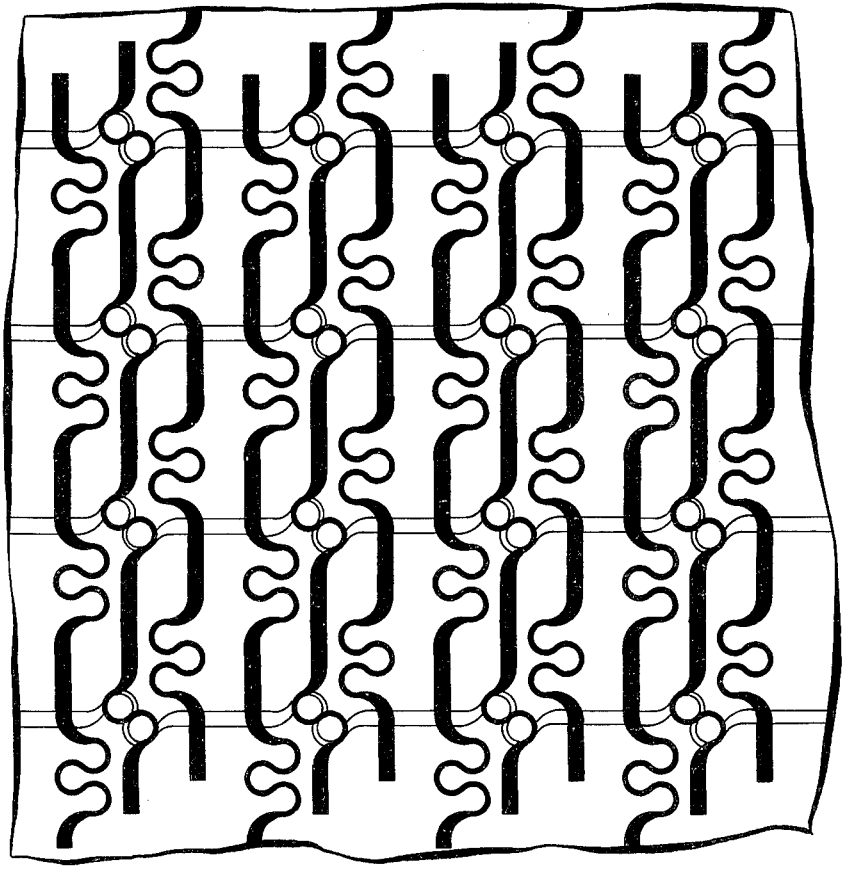
FIG. 7 is a top view of an array of the conductor patterns shown in FIG. 4 and FIG. 5, respectively, showing the interconnection required in the multi-bit extension.

Although FIG. 6 shows only one bit of the disclosed correlation-type memory, a multiple of conductor triplets each having multiple conductor configurations in series may be placed in spaced parallel relationship to each other in a plane parallel to one of the major surfaces of the crystalline platelet. FIG. 7 represents the conductor pattern for such a multibit extension, showing a plurality of first conductor triplets 40 and a plurality of second conductor triplets 41 (sensing conductors and permalloy bars not shown) respectively, for a 4 × 4, 16 bit random access parallel processor correlating memory. Further expansion of the number of bits in the disclosed memory will be obvious to those skilled in the art.

In the conductor pattern for the correlation-type memory, illustrated for example in FIG. 7, there are both active and inactive curvature portions as in the first described bistable memory embodiment of FIG. 6. In the preferred embodiment, the inactive curvature portions are of larger radius than the active curvature portions to prevent the capture of bubbles at spurious locations as previously mentioned.

The operation of a typical bit in the correlator-type memory of FIGS. 6 and 7 can be understood with reference to FIGS. 8a through 8d which show a typical bit configuration of a typical first conductor triplet. At each of the two wavering loop interrogation patterns and at the bistable loop memory pattern, a permanent resident magnetic domain bubble is installed. For clarity, the second superimposed conductor triplet is not shown. However, it will be appreciated that current flowing through first stored memory line 52 induces an insufficient magnetic field by itself to change the location of the memory bubble and thus requires the coincident cooperative current flowing through the stored memory line of the orthogonal superimposed second conductor triplet which is not shown. It will also be noted that the current flowing through interrogation lines 50 and 51 does not suffice by itself to overcome the wavering of the readout bubbles in the respective patterns 53 and 54 and requires the influence of the adjacent memory bubble to change locations. Finally, it should be noted that the sensing means in the interrogating lines (not shown) are aligned to sense the presence of bubbles in readout regions 92 and 93.

Figure 8A:
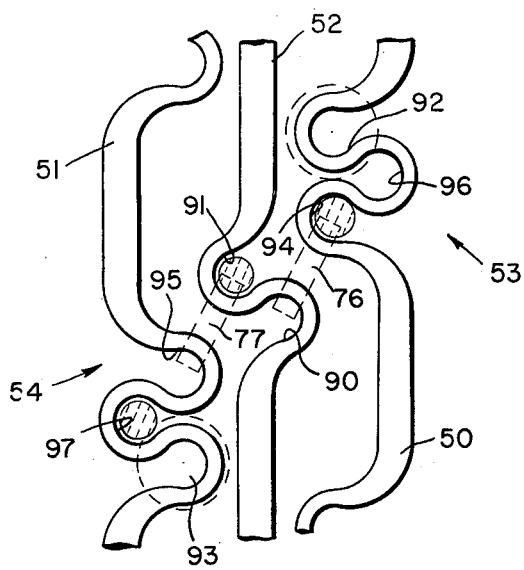
FIGS. 8a, 8b, 8c and 8d reproduce the conductor pattern shown in FIG. 6 and illustrate the logic states of the bubbles in the operation of the correlator-type memory.
Figure 8B:
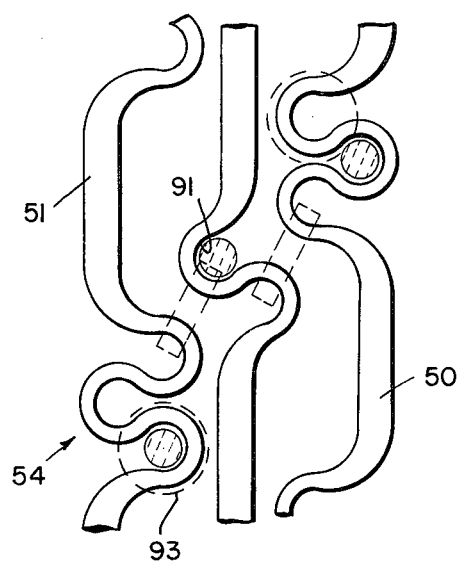
Figure 8C:
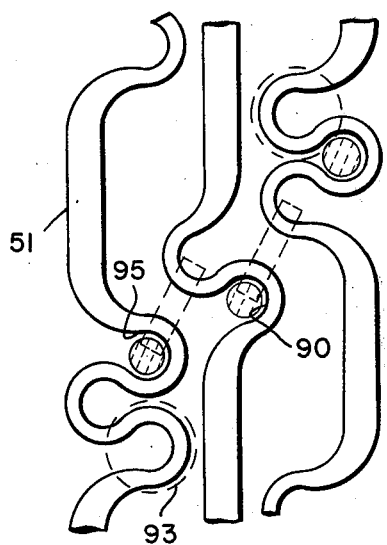
Figure 8D:
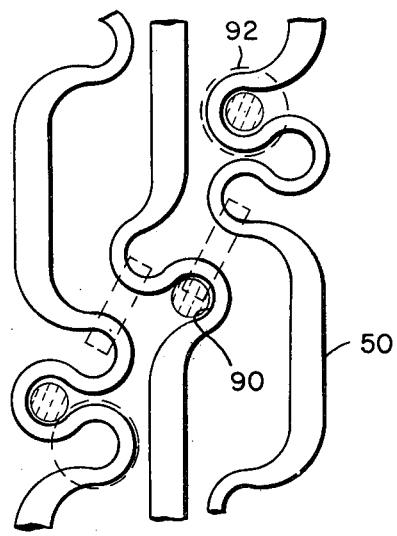

Referring particularly to FIGS. 8a and 8b, the memory bubble is shown in region 91 which is designated as the "store zero" region, indicating that a zero is stored in memory. In FIGS. 8c and 8d, the memory bubble is shown in region 90 which is designated as the "store one" region indicating that a one is stored in memory. The permalloy coupling bars 76 and 77 impose on the wavering bubbles in the wavering loop regions 53 and 54 the necessary decision control to enable them to perform the interrogating function. For example, the permalloy bar 77 will carry the repulsive flux of one pole of the data storing bubble 91 to the adjacent region 95 of the interrogating wavering loop 54 making it impossible for the interrogating bubble in region 97 to transfer to region 95 when the interrogating current pulse is imposed on it. Instead the interrogating bubble will transfer to loop 93. In this manner the repulsion of like poles provides the decision function for the wavering loop interrogator 54. Conversely, since no bubble resides in the "store one" region 90 and the most recent current pulse flowing through conductor 52 induced a permanent attraction field in the permalloy bar 76, the wavering loop 53 will transfer its bubble from loop 96 to loop 94 whose attraction is stronger than that of loop 92 which has no permalloy flux enhancement. Thus, the influence of the bubble stored in the center bistable loop determines the position of the adjacent interrogating bubbles in their respective wavering loops.

In operation, the results of the interrogation are detected at the regions 92 and 93. For example, when current flows through interrogating lines 51 and 50 in the direction that tries to force the interrogating bubbles into one of the two side loops of their respective wavering loops to determine whether a "one" is stored in the adjacent bistable memory loop, the resident bubbles in the wavering loops portions 53 and 54 will be attracted to regions 94 or 95 respectively depending on the location of the memory bubble. Thus when regions 92 and 93 are interrogated by their respective magnetoresistive sensors their output will be an indication of the location of a bubble. Conversely, the absence of the memory bubble allows the interrogating bubbles to be attracted by the permalloy bar and move to region 94 or 95 resulting in the absence of a signal at the sensing sites 92 and 93. The result of these magnetic interactions is shown in FIG. 8a where interrogating line 50 is energized and has detected that loop 90 (store "one") is empty.

In FIG. 8b, a "zero" is again stored. Interrogating line 51 is energized resulting in the transfer of the bubble in the wavering loop region 54 to region 93. When the readout region 93 is observed, a bubble will be detected resulting in an output which indicates a positive response to the inquiry, i.e., that a "zero" is in fact stored in memory.

A similar process occurs in FIG. 8c where a "one" is stored. The inquiry current pulse passes through interrogator line 51 and asks whether a "zero" is stored. The resident bubble in the wavering loop moves to region 95 so that when readout region 93 is observed, no bubble is detected, resulting in an output of "zero" which indicated a negative response to the inquiry, i.e. the "zero" site is empty.

Finally, in FIG. 8d, a "one" is again stored. The inquiry current flow through interrogator line 50 asks whether a "one" is in fact stored. The resident bubble in the wavering loop moves to region 92 so that when region 92 is observed, a bubble is detected, resulting in an output of "one" which indicates a positive response to the inquiry, i.e. a "one" is present. In this manner line 51 will provide a positive correlation for "zero", i.e. when asked "is there a zero" it will return the indicating answer signal. Similarly, line 50 will provide a positive correlation for "one". During the period that one interrogating line queries the memory the other line can be idle with the wavering bubble in the stable center position. This allows for time multiplexing of the magnetoresistor signals.

All interrogating bubbles in their respective wavering loops can be returned to the center-idle position, such as at a time between interrogations, by a current pulse of suitable polarity through the wavering loop alone. No supplemental magnetic influence is required for this return transfer since the magnetomotive forces on the bubble in either side loop are unequivocally directed toward the center loop.

What is claimed is:

1. A conductor configuration for positioning a captured magnetic bubble in a magnetic domain device comprising a uniaxial anisotropic magnetocrystalline platelet in a magnetic bias field, said conductor configuration comprising:

a. a wavering loop pattern defining three contiguous domain retaining regions in magnetic field coupled relationship to the crystalline platelet, said pattern oriented so that current flowing through the conductor pattern induces a magnetic field having a first polarity in a center region and a magnetic field having an opposite polarity in the remaining two regions, and b. decision control means for selectively directing a bubble into one of said remaining regions when current flowing in the wavering loop pattern induces a magnetic field of said first polarity having a tendency to repel the magnetic bubble from the center region.

2. An improved random access memory device of the type utilizing cylindrical magnetic domains movable in a plane parallel to a major surface of at least one crystal platelet and having a magnetic field generating domain positioning array of electrical conductors positioned in magnetic field coupled relationship to the crystal platelet to define therein an array of binary bit memory locations each of which can store a representation of a binary zero or a binary one, as represented by a selected positioning of one of the movable magnetic domains at a particular portion of the bit location, the improvement comprising:

a. a first set of electrical conductors comprising a plurality of first conductors all extending in spaced substantially parallel relationship to each other in a first direction in a first plane parallel to a major surface of the crystal platelet, each of said first conductors comprising a plurality of wavering loop patterns electrically coupled in the first direction in series to form a plurality of rows and nonelectrically aligned in a second direction to form a plurality of columns, one wavering loop pattern defining each bit location wherein each of the wavering loop patterns define three contiguous domain retaining regions, the first of said regions representing a stored binary one state, the second of said regions, located in the middle position, representing an idle-reset state, and the third of said regions representing a stored binary zero state, said pattern at each bit location being coupled to the pattern of at least one adjacent bit location by at least one straight conductor run which provides with said patterns a single continuous path for the flow of current and which does not cross any other conductor in its set;

b. decision control means at each bit for selectively directing the bubble into either the first or the third region when current flows through the wavering loop pattern in a direction which repels the bubble from the middle position representing the idle-reset state; and c. means to simultaneously control said decision control means and to supply a drive current to any preselected conductor to provide an addressable binary memory.

3. The random access memory device of claim 2 wherein said decision control means comprises a set of conductor pairs, each pair controlling a column of wavering loop conductor patterns, each of said pairs comprising:
 a. a first aid-inhibit control conductor in magnetic field coupling relationship to said crystalline platelet oriented to bisect said first and second regions at each bit location in a selected unique wavering loop column;
 b. a second aid-inhibit control conductor in magnetic field coupling relationship to said crystalline platelet oriented to bisect said second and third regions at each bit location in said selected unique wavering loop column, said set of conductor pairs being electrically insulated from said first set of electrical conductors;
 c. means for selectively supplying drive current to the conductors of said first set of electrical conductors; and
 d. means for supplying aid-inhibit current to at least one conductor in each of said conductors in said set of conductor pairs to thereby provide an addressable binary memory.

4. The random access memory device of claim 3, further comprising means for sensing, at each bit location, the presence or absence of a magnetic domain bubble in one of the three regions defined by the wavering loop pattern.

5. The random access memory device of claim 4 wherein the sensing means comprises an optical illumination means positioned on one side of said crystalline platelet and an optical detection means for sensing the presence of a bubble in a selected region at each bit location on the other side of said crystalline platelet.

6. The random access memory device of claim 4 wherein said active loop portions have radii which are less than 55% of the radii of the inactive loop portions.

7. The random access memory device of claim 3 having in the wavering loop conductor pattern a plurality of inactive curvature portions and a plurality of active loop curvature portions wherein the radii of the inactive curvature portions are larger than the radii of the active loop curvature portions to prevent the capture of bubbles in regions defined by the inactive curvature portions.

8. The random access memory device of claim 7 having in the conductor pattern a plurality of inactive loop curvature portions and a plurality of active loop curvature portions wherein the radii of the inactive curvature portions are larger than the radii of the active loop curvature portions to prevent the capture of bubbles in regions defined by the inactive loop curvature portions.

9. An improved random access memory device of the type utilizing cylindrical magnetic domains movable in a plane parallel to a major surface of at least one crystal platelet and having a domain positioning magnetic field generating array of electrical conductors positioned in magnetic field coupled relationship to said crystal platelet to define therein an array of binary bit memory locations each of which can store a representation of a binary zero or a binary one, as represented by a selected positioning of one of said movable magnetic domains at a particular portion of said bit location, the improvement comprising:
 a. a first domain positioning-sensing means comprising a plurality of first conductor triplets all extending in spaced substantially parallel relationship to each other in a first direction in a first plane parallel to a major surface of said crystal platelet, wherein at each bit location said first conductor triplet comprises:
  1. a first interrogating line having a first wavering loop portion with one of said loops in a first sensing site,
  2. a second interrogating line having a second wavering loop portion with one of said loops in a second sensing site,
  3. a first stored memory line located between said first and second interrogating lines having a first conductor configuration to define at least one first domain retaining region;
 b. a second domain positioning-sensing means electrically insulated from said first domain positioning-sensing means comprising:
  1. a plurality of second stored memory lines extending in spaced parallel relationship to each other in a second direction different from the first direction of said first stored memory lines in a second plane parallel to the major surface of the crystal platelet, each of the second stored memory lines having a plurality second conductor configurations in series, wherein at each bit one of said first conductor configurations is aligned to cooperate with one of said second conductor configurations in magnetic coacting relationship with said crystalline platelet to define two contiguous domain retaining memory regions therein, the first region representing a stored binary one and the second region representing a stored binary zero, said regions configured to allow the positioning of the movable domains in one of the regions with the magnetic field generated by electrical current flowing in a continuous path through each of the first and second conductor configurations,
  2. at each bit location, a first sensing means in magnetic domain sensing relationship with the first sensing site in the wavering loops portion of the first interrogation line,
  3. at each bit location, a second sensing means in magnetic domain sensing relationship with the second sensing site in the wavering loops portion of the second interrogating line,
  4. at each bit location, a first coupling means in magnetic coacting relationship between one of the contiguous domain retaining memory regions and one loop in the wavering loop region in the first interrogating line,
  5. at each bit location, a second coupling means in magnetic coacting relationship between the other contiguous domain retaining memory region and one loop in the wavering loop region in the second interrogating line,
 c. means to supply drive currents to preselected conductors to provide an addressable binary memory which can be interrogated in parallel.

10. The random access memory device of claim 9 wherein said active loop portions have radii which are less than 55% of the radii of the inactive loop portions.

11. An improved random access memory device of the type utilizing cylindrical magnetic domains movable in a plane parallel to a major surface of at least one crystal platelet and having a domain positioning magnetic field generating array of electrical conductors positioned in magnetic field coupled relationship to said crystal platelet to define therein an array of binary bit memory locations each of which can store a representation of a binary zero or a binary one, as represented by a selected positioning of one of said movable magnetic domains at a particular portion of said bit location, the improvement comprising:

a. a plurality of first conductor triplets all extending in spaced substantially parallel relationship to each other in a first direction in a first plane parallel to a major surface of said crystal platelet, wherein at each bit location said first conductor triplet comprises:
 1. a first interrogating line having a first wavering loop portion wherein one of said loops is in a first sensing position,
 2. a second interrogating line having a second wavering loop portion wherein one of said loops is in a second sensing position,
 3. a first stored memory line located between said first and second interrogating lines having a first conductor configuration to define at least a first domain retaining region;

b. a plurality of second conductor triplets electrically insulated from said first conductor triplets, all extending in spaced parallel relationship to each other in a second direction different from said first direction in a second plane also parallel to the major surface of the crystal platelet, wherein at each bit location each of the second conductor triplets comprises:
 1. a first sensing line containing a first sensing site,
 2. a second sensing line containing a second sensing site,
 3. a second stored memory line located between the first and second sensing lines defining at least a second domain retaining region,
 4. a first permalloy coupling region in the apertures of the first loop in the domain retaining region of the second stored memory line,
 5. a second permalloy coupling region in the apertures of the second loop in the domain retaining loops region of the second stored memory line;

c. a configuration of said first and second sets of conductor triplets wherein at each bit location one of said first conductor triplets is aligned with one of said second conductor triplets so that:
 1. the first domain retaining region in the first stored memory line is aligned in magnetic coacting relationship with the second domain retaining region in the second stored memory line, to define two contiguous domain retaining regions, the first region representing a stored binary one and the second region representing a stored binary zero, said domain regions configured to allow the positioning of the movable domains in one of the regions with the magnetic field generated by electrical current flowing in a continuous path through the stored memory lines,
 2. the loop in the first sensing position of the first interrogating line is in magnetic domain sensing relationship with the sensing site of the first sensing line,
 3. the loop in the second sensing position of the second interrogating line is in magnetic domain sensing relationship with the sensing site of the second sensing line,
 4. the first permalloy coupling region is in magnetic coupling relationship between the first domain retaining region defined by the stored memory lines and one loop in the wavering loop portion in the first interrogating line,
 5. the second permalloy coupling region is in magnetic coupling relationship between the second domain retaining region defined by the stored memory lines and one loop in the wavering loop portion in the second interrogating line.

12. A meandering conductor pattern for the control of cylindrical domains in uniaxial anisotropic magnetic crystal platelets comprising three connected loops of sequentially opposing direction, said meandering conductor pattern providing a singular directing magnetomotive force toward the center loop under the influence of a first current direction, and an unstable splitting magnetomotive force toward the two external loops under the influence of a second opposing current direction.

13. An improved random access memory device of the type utilizing cylindrical magnetic domains movable in a plane parallel to a major surface of at least one crystal platelet and having a domain positioning magnetic field generating array of electrical conductors positioned in magnetic field coupled relationship to said crystal platelet to define therein an array of binary bit memory locations each of which can store a representation of a binary zero or a binary one, as represented by a selected positioning of one of said movable magnetic domains at a particular portion of said bit location, the improvement comprising:

a. memory means comprising two contiguous domain retaining memory regions for retaining a first captured magnetic bubble in a selected one of said regions;
b. correlation means comprising:
 1. a first wavering loop pattern defining a first set of three contiguous domain retaining regions for retaining a second captured magnetic bubble in a selected one of said regions of said first set;
 2. a second wavering loop pattern defining a second set of three contiguous domain retaining regions for retaining a third captured magnetic bubble in a selected one of said regions of said second set;
c. coupling means for positioning the bubbles in one region in each of said first and second wavering loop patterns as a function of the position of the memory bubble in the domain retaining memory regions; and
d. sensing means for sensing a bubble in a selected region in at least one of said wavering loop patterns.

* * * * *